(12) United States Patent
Hassan et al.

(10) Patent No.: US 12,196,803 B2
(45) Date of Patent: Jan. 14, 2025

(54) SIGNAL TEST

(71) Applicant: Infineon Technologies AG, Neubiberg (DE)

(72) Inventors: Muhammad Hassan, Munich (DE); Jens Rosenbusch, Munich (DE)

(73) Assignee: Infineon Technologies AG, Neubiberg (DE)

( * ) Notice: Subject to any disclaimer, the term of this patent is extended or adjusted under 35 U.S.C. 154(b) by 198 days.

(21) Appl. No.: 17/713,308

(22) Filed: Apr. 5, 2022

(65) Prior Publication Data
US 2022/0326298 A1 Oct. 13, 2022

(30) Foreign Application Priority Data
Apr. 9, 2021 (DE) .................. 10 2021 108 930.1

(51) Int. Cl.
*G01R 31/28* (2006.01)
*G01R 31/317* (2006.01)
*G01R 31/3177* (2006.01)

(52) U.S. Cl.
CPC ........ *G01R 31/2841* (2013.01); *G01R 31/31715* (2013.01); *G01R 31/31725* (2013.01); *G01R 31/3177* (2013.01)

(58) Field of Classification Search
CPC .......... G01R 31/2841; G01R 31/31715; G01R 31/31725; G01R 31/3177
USPC ...... 324/600, 500, 520, 522, 762.03–762.06, 324/763.01, 750.22, 757.05, 207.13
See application file for complete search history.

(56) References Cited

U.S. PATENT DOCUMENTS

| | | | |
|---|---|---|---|
| 2003/0115515 A1* | 6/2003 | Curtis ................ | H04W 24/00 714/712 |
| 2005/0022074 A1* | 1/2005 | Kuzmenka ......... | G06F 11/0751 714/57 |
| 2010/0109678 A1* | 5/2010 | Wong ............ | G01R 31/318555 324/555 |
| 2010/0188097 A1* | 7/2010 | Sul ................. | G01R 31/31717 702/120 |
| 2016/0349320 A1* | 12/2016 | Laisne ............ | G01R 31/31724 |

OTHER PUBLICATIONS

Akare et al. "Performance of Simulink Based SSOFDM Model for Broadband Wireless Access Network" 2009 Second International Conference on Emerging Trends in Engineering & Technology, published on Dec. 16, 2009.

* cited by examiner

*Primary Examiner* — Alexander Satanovsky
*Assistant Examiner* — Trung Q Nguyen
(74) *Attorney, Agent, or Firm* — Eschweiler & Potashnik, LLC (57) ABSTRACT

Testing of at least one source by a destination is provided, which comprises: (i) the destination supplies a test signal towards the at least one source; (ii) at the at least one source, determining a second output signal based on a first output signal and the test signal via a first function; (iii) conveying the second output signal to the destination; (iv) at the destination, determining a received signal based on the second output signal received from the at least one source and based on the test signal via a second function; and (v) determining whether an error occurred based on the received signal. Also, an according system is provided.

20 Claims, 6 Drawing Sheets

SIGNAL TEST

REFERENCE TO RELATED APPLICATION

This Application claims priority to German Application number 10 2021 108 930.1, filed on Apr. 9, 2021, the contents of which are hereby incorporated by reference in their entirety.

BACKGROUND

In a communication system, several sources convey information towards a destination. Each source may comprise a driver that may be or comprise a safety-important logic circuitry. This safety-important logical circuitry may comprise a safety mechanism that allows detecting internal faults of the driver.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings, the same reference characters denote like features.

DETAILED DESCRIPTION

It is one objective to become aware of faults that may occur on the communication link between the source and the destination. There are several possibilities for such failures on the signal lines; one prominent is a stuck-at-fault, which is associated with a permanent logical state conveyed across the line without being able to switch to another logical state. In particular, with regard to safety requirements, it is important to also become aware of any such stuck-at-fault. If the line is used to convey an alarm notification indicated by a logical state 1 and the line is stuck at the logical state 0, the destination is not able to become aware of any alarm via this line.

Described herein are systems, methods, and circuitries that allow for an improved signal test that in particular increases the safety of a device, system or any kind of implementation. In this manner, the system may become aware of stuck-at-faults that may occur on connections of a communication system.

Figure 1:
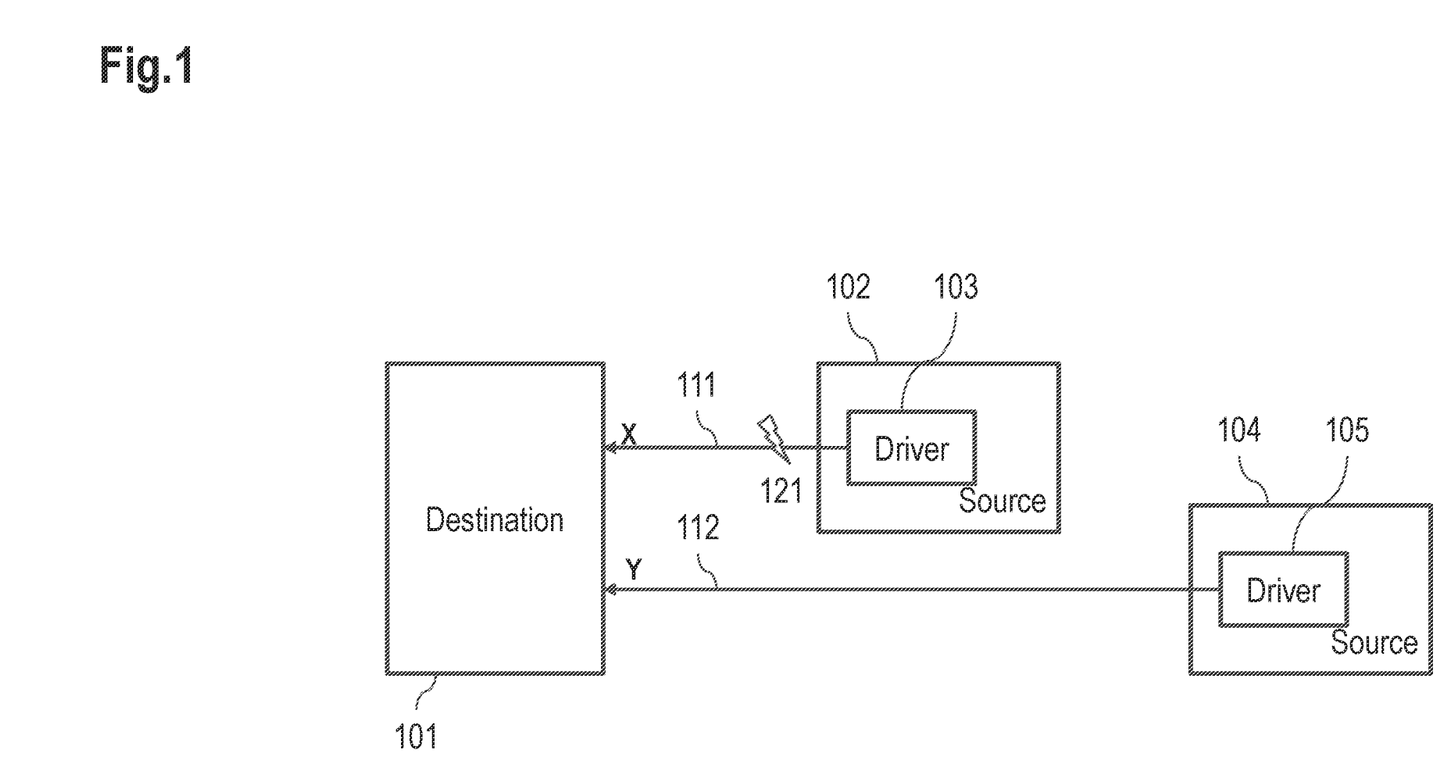
FIG. 1 is a diagram outlining an exemplary communication between several sources and a destination.

FIG. 1 is a block diagram of an exemplary system illustrating the communication between a source 102 and a destination 101 and a source 104 and the destination 101. The source 102 comprises a driver 103 that is connected via a line 111 to the destination 101. The source 104 comprises a driver 105 that is connected via a line 112 to the destination 101. The destination 101 receives a signal X from the driver 103 and a signal Y from the driver 105. It is a general motivation for the destination 101 to become aware of any failure occurring on the lines 111 and 112 (see exemplarily failure 121 on line 111).

Figure 2:
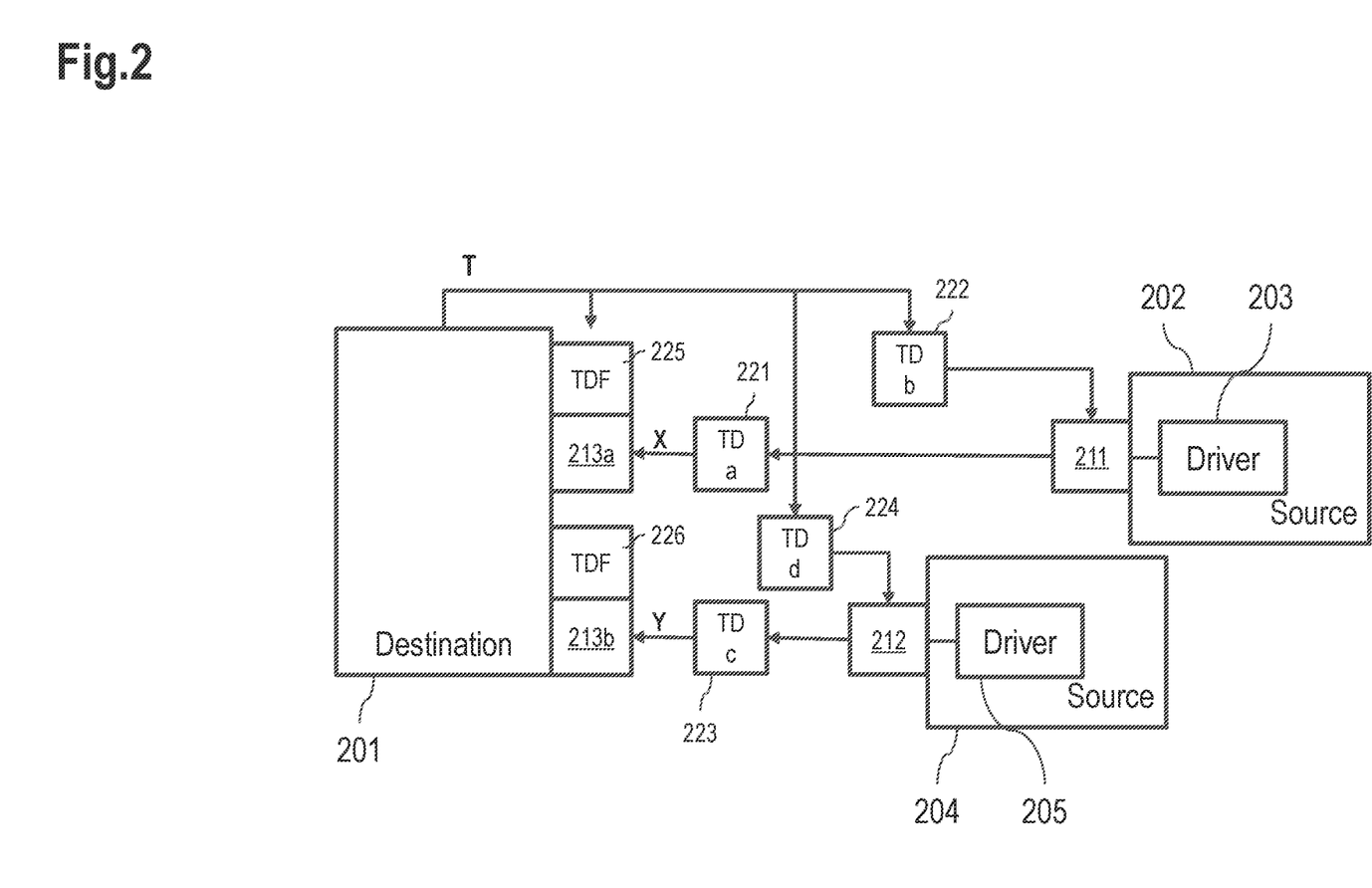
FIG. 2 is a block diagram of an exemplary system for enabling a safety-important test of the lines between various sources and a destination.

FIG. 2 is a block diagram of an exemplary system that enables a safety-important test of the lines between various sources 202, 204 and a destination 201.

The source 202 and the source 204 each communicate with the destination 201 over signal lines. The source 202 comprises a driver 203 and the source 204 comprises a driver 205. The destination 201 receives a signal X from the driver 203 and a signal Y from the driver 205.

In addition, the destination is able to provide a test signal T towards the source 202 and the source 204.

A logical function circuitry 211 is implemented at the source 202, in particular at the signal source boundary of the source 202.

A logical function circuitry 212 is implemented at the source 204, in particular at the signal source boundary of the source 204.

A logical function circuitry 213a, 213b is implemented at the destination 201, in particular at the signal destination boundary of the destination 201 towards the sources 202, 204. It is noted that the logical function circuitries 213a and 213b can be realized as a single circuitry.

The logical function circuitries 211 and 212 may each implement a function FUNC and the logical function circuitries 213a, 213b may each implement an inverse function I_FUNC, wherein $$FUNC = I\_FUNC^{-1}.$$

For example, the exclusive-or function (XOR) can be used as function, wherein the XOR function is also its inverse function.

The function FUNC uses the output of the respective driver and the test signal T to derive a signal that is conveyed towards the destination 201. In case of no error, the signal received at the destination is the correct signal.

As an option, the signal runtime (time delay, TD) across the various lines may be considered:
- a time delay a for the signal X from the source 202 to the destination 201 (see box 221);
- a time delay b for the test signal T from the destination 201 to the source 202 (see box 222);
- a time delay c for the signal Y from the source 204 to the destination 201 (see box 223);
- a time delay d for the test signal T from the destination 201 to the source 204 (see box 224).

A signal runtime compensation filter (time delay filter, TDF) 225, 226 is provided at each of the logical function circuitries 213a and 213b to synchronize the effect of the test signal T on the sources 202, 204 as well as the destination 201. The filter 225 compensates the time delay a+b and the filter 226 compensates the time delay c+d.

The signal T is also conveyed to or available at each of the function circuitries 213a, 213b and the filters 225 and 226.

A signal line test may initiate a test at the destination 201 utilizing the test signal T, which may be toggled between a test mode (also referred to as "test mode on") and a normal mode (also referred to as "test mode off"). Advantageously, the effect induced by the test signal T is fully transparent because of the implementation of the functions FUNC and I_FUNC as will be shown in more detail below.

Figure 3:
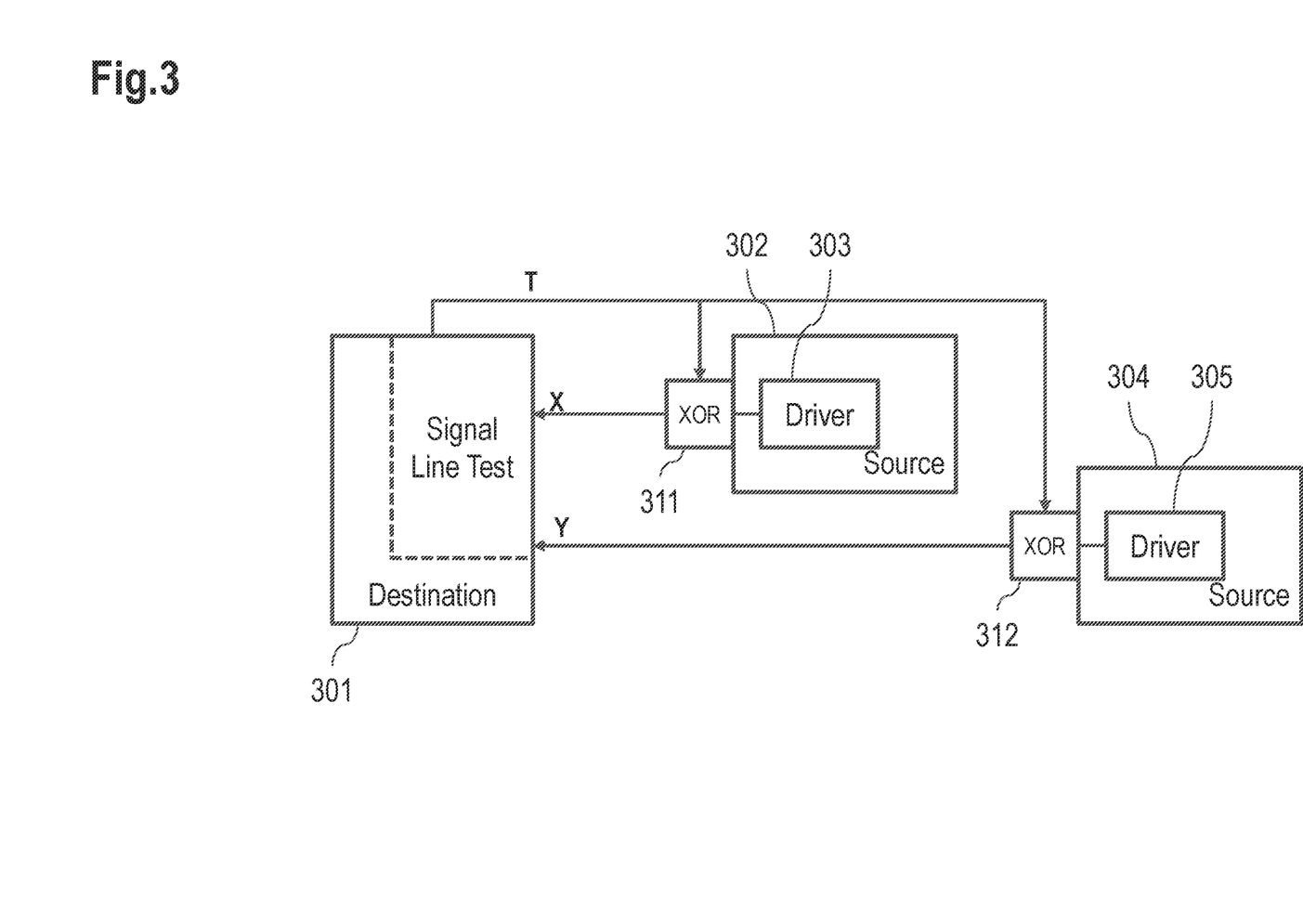
FIG. 3 is a block diagram of an exemplary system comprising a destination and two sources, wherein the test signal is toggled in combination with an XOR function at each of the sources.

FIG. 3 is block diagram of an exemplary system comprising a destination 301, a source 302 with a driver 303 and a source 304 with a driver 305. A logical function circuitry 311 is provided at the source 302 and a logical function circuitry 312 is provided at the source 304. Each logical function circuitry 311, 312 implements an exclusive-or (XOR) function as function FUNC and is supplied by a test signal T from the destination 301.

The destination 301 comprises a signal line test functionality implementing the function I_FUNC, which is also an XOR-function. This signal line test functionality may be implemented in hardware and/or software.

The logical function circuitry 311, 312 is preferably implemented at the signal source boundary of the respective source 302, 304 towards the line to the destination 301.

The signal line test can be initiated by the destination via the test signal T. The test signal T can be used to switch between a test mode and a normal mode (i.e., toggle the test mode on and off).

A signal X is received from the source 302 at the destination 301 and a signal Y is received from the source 304 at the destination 301.

This embodiment has the advantage that latent fault coverage is improved and in particular stuck-at-faults can be recognized. Another advantage is that the embodiment has no or only little effect on a start-up time of the driver and that the test is transparent to the utilization of the communication line between the respective source 302, 304 and the destination 301. Also, the setup does not require any dedicated time-consuming error injection and assessment per individual line.

As an option, the destination 301 may be a safety management unit (SMU) and the signals X, Y may be alarm signals provided by the respective source 302, 304. Each of the drivers 303, 305 may implement at least one safety mechanism (SM). Hence, the safety mechanism issues an alarm that is XOR-combined with the test signal T by the logical function circuitry 311, 312. The SMU may utilize a bit that is to be used as the test signal T and conveyed towards the sources 302, 304. This bit (test signal T) can be toggled in order to detect stuck-at-faults on the communication lines.

Figure 4:
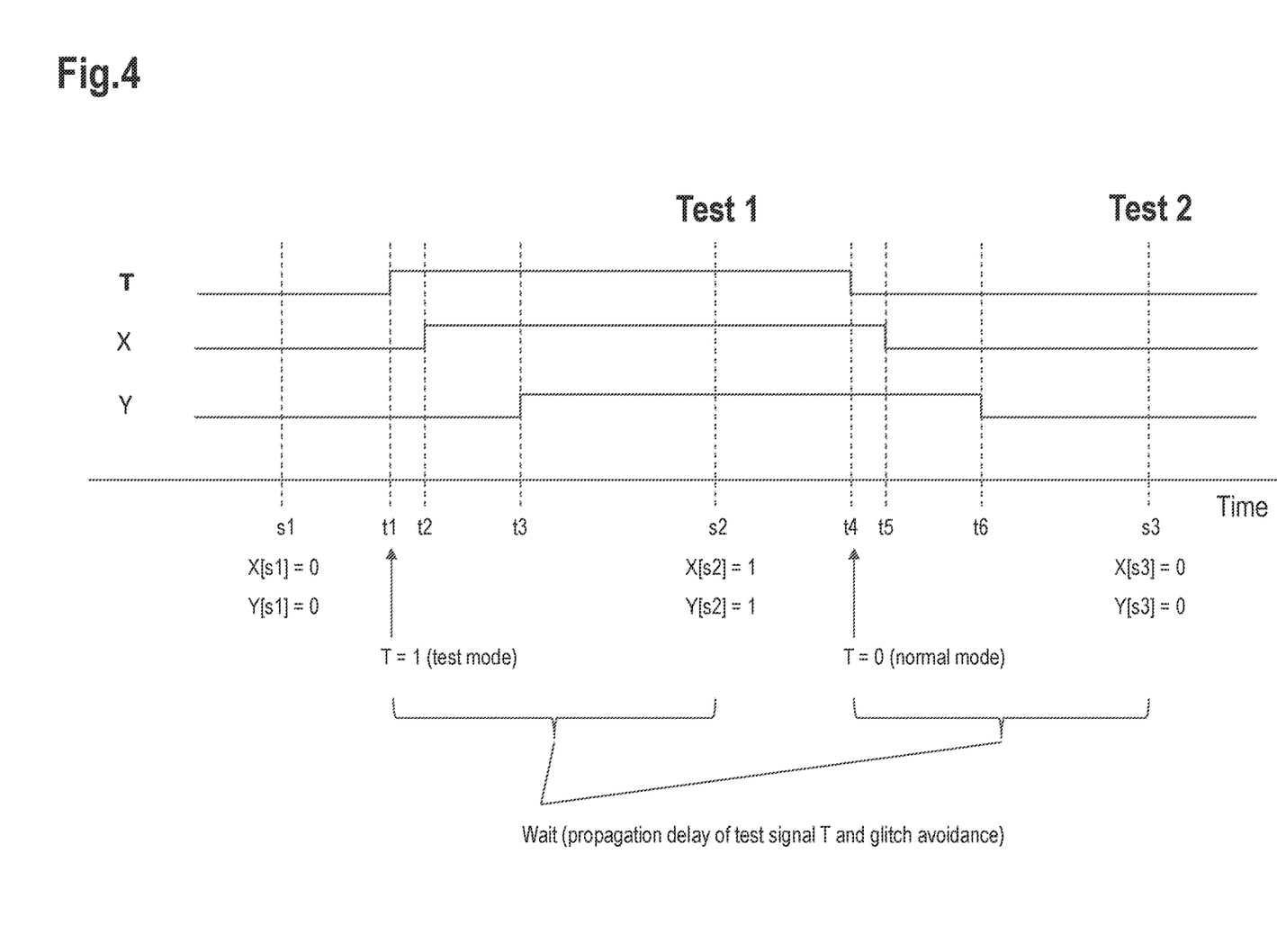
FIG. 4 is signal diagram of an example of the arrangement of FIG. 3 showing in particular the test signal T, the signal X and the signal Y across the time.

FIG. 4 is a signal diagram for an example of the arrangement of FIG. 3. The signal diagram comprises the test signal T, the signal X and the signal Y across the time.

According to the XOR function, the signal supplied by the respective source 302, 304 remains unchanged if the test signal T is 0 and it is inverted in case the test signal T is 1.

In the example shown in FIG. 4, at the beginning T=X=Y=0. At a time t1 the test signal T is set to 1. Due to a time delay TD1 introduced by the connection between the destination 301 and the source 302, the signal X is inverted to X=1 at a time t2. Accordingly, due to a time delay TD2 introduced by the connection between the destination 301 and the source 304, the signal Y is inverted to Y=1 at a time t3.

At a time t4 the test signal T is set to 0. Due to the time delay TD1 the signal X is inverted to X=0 at a time t5 and due to the time delay TD2 the signal Y is inverted to Y=0 at a time t6.

The signals may be sampled per time interval at a time after the longest time delay has passed and before the next test signal T is switched to 0 or 1. In the example of FIG. 4, the sampling times are indicated as s1, s2 and s3. In case of a periodical or clock-based approach, s1 may be referred to as the first sample interval, s2 as the second sample interval, etc. The time difference between the sampling times may be constant or substantially constant.

It is noted that any periodicity can be used to conduct lines tests as described herein, i.e., toggle the test signal T between, e.g., consecutive time intervals.

The following tests can be conducted by the destination 301:

Test 1: Compare the signal values at the sampling time s2 with the signal values at the sampling time s1: If the respective signals X and Y are inverted, the test is passed. If the inversion cannot be determined at the destination 301, a failure has occurred (e.g., a stuck-at-fault on the respective line or a real signal transition on X or Y, which indicates a fault at the source).

Test 2: Compare the signal values at the sampling time s3 with the signal values at the sampling time s2: If the respective signals X and Y are not inverted, the test is passed. If the inversion is determined at the destination 301, a failure has occurred (e.g., a stuck-at-fault on the respective line or a real signal transition on X or Y, which indicates a fault).

It is noted that the signals T, X and Y may be synchronized with or based on a clock signal CLK, in particular utilizing falling edges and/or rising edges of the clock signal.

Due to the test signal T being switched to "test mode", i.e., T=1 for the sampling at the time s2, it is expected that the signal X at the time s1 is different from the signal X at the time s2:

$$X[s1] \neq X[s2]?\quad(1)$$

This can easily be checked by the destination 301 by combining the received signals X with the test signal T via an XOR function: If the results are identical, then there is no error, otherwise an error has occurred:

$$X[s1]\oplus T[s1]==X[s2]\oplus T[s2]?\quad(2)$$

If no error occurred, equation (2) is true. If the signal X is stuck at 0 at the time t2, equation (2) is false. If the signal Y is stuck at 1 before t1, the inversion due to the test signal T switching from 0 to 1 at the time t1 does not happen and equation (2) is false. This mechanism works accordingly for other test periods as well as for other signals like the signal Y.

Also, a stuck-at-fault of the test signal T can be detected because no inversion will be triggered by the logical function circuitry 311, 312. However, as the destination 301 expects such inversion, equation (2) is then false for both signals X and Y.

It is beneficial to detect stuck-at-faults that may be based on the connection between the source 302, 304 and the destination 301, because the destination 301 may still be used despite at least one connection to the sources 302, 304 being defective.

It is noted that the destination may be a management system or a (multi-purpose) device like a microcontroller.

Figure 5:
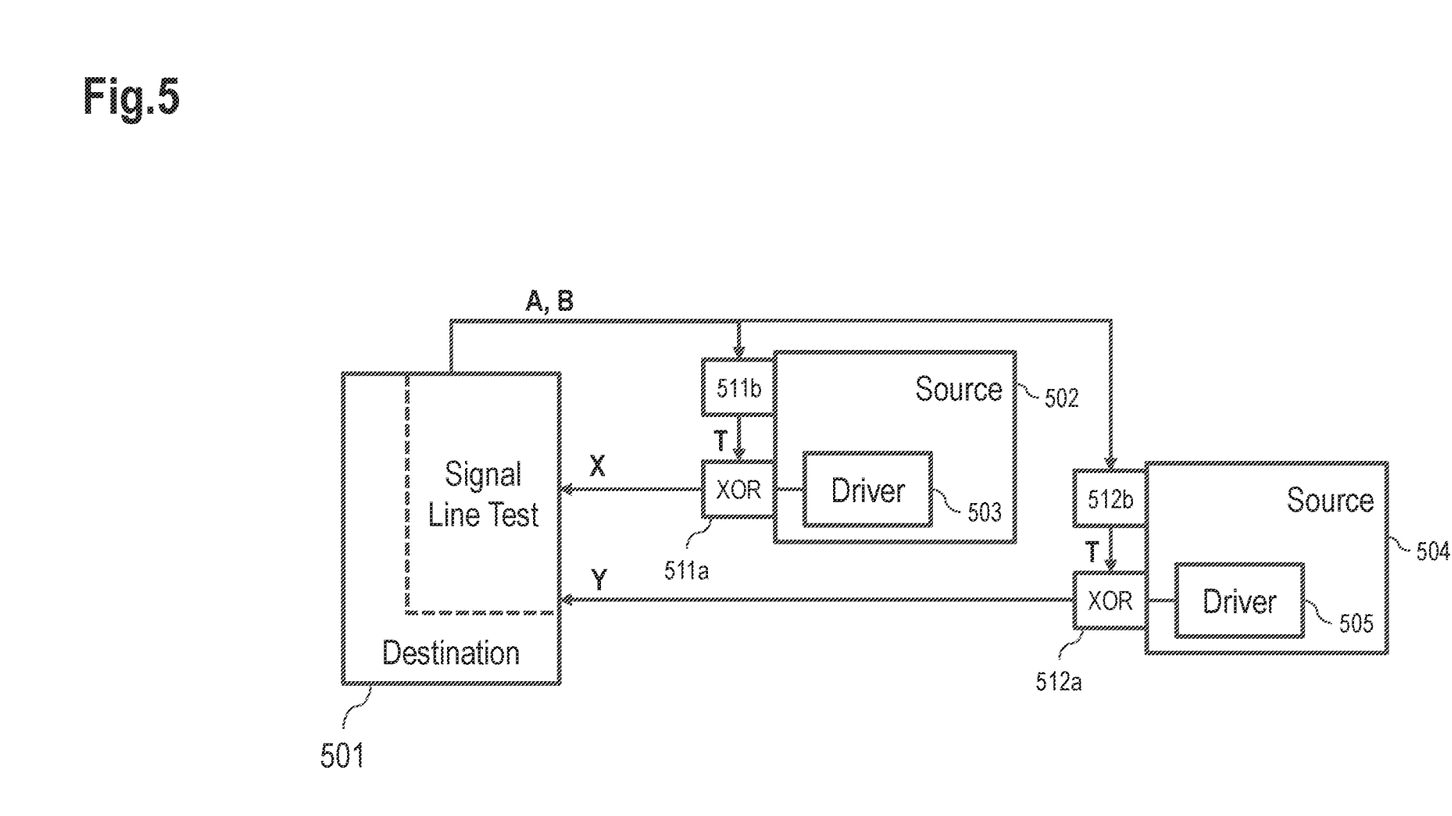
FIG. 5 is a block diagram of another exemplary system comprising a destination and two sources, wherein binary signals A and B are conveyed from the destination towards the sources and are combined at a logical function circuitry at each of the sources to a signal T that is fed to an XOR-function.

FIG. 5 is block diagram of another exemplary system comprising a destination 501, a source 502 with a driver 503 and a source 504 with a driver 505. A logical function circuitry 511a and a test logic 511b are provided at the source 502 and a logical function circuitry 512a and a test logic 512b are provided at the source 504. Each logical function circuitry 511a, 512a implements an XOR function as function FUNC. The inverse function I_FUNC may also be the XOR function and may be part of the implementation of the destination 501.

Test signals A and B are supplied by the destination 501 towards the test logic 511b and the test logic 512b. The test logic 511b determines a test signal T based on the signals A and B and supplies this test signal T to the logical function circuitry 511a. Accordingly, the test logic 512b determines a test signal T based on the signals A and B and supplies this test signal T to the logical function circuitry 512a. If both test logics 512a and 512b receive the same test signals A and B, the test signal T may be the same.

The test signal T may be determined based on the test signals A and B as follows:

$$T=A \oplus (A \cdot B),$$

wherein "$\oplus$" indicates the XOR function and "•" indicates the logical AND function. A truth table can be summarized as follows:

| A | B | A · B | T | |
|---|---|---|---|---|
| 0 | 0 | 0 | 0 | A or B stuck at 0 |
| 0 | 1 | 0 | 0 | Normal Mode |
| 1 | 0 | 0 | 1 | Test Mode |
| 1 | 1 | 1 | 0 | A or B stuck at 1 |

A signal X is received from the source 502 at the destination 501 and a signal Y is received from the source 504 at the destination 501.

The destination 501 hence produces the signals A and B and the test logic 511b, 512b determines the test signal T based on the signals A and B. The test signal T is used by the logical function circuitry 511a, 512a to trigger the normal mode (T=0) or the test mode (T=1). At the destination 501, the signals received X, Y may be processed based on the same test signal $$T=A \oplus (A \cdot B)$$

in order to obtain the same signal as provided by the driver 503, 505. This can be achieved by feeding the incoming signals X, Y to an XOR function using the above test signal T:

$$X \oplus T,$$

$$Y \oplus T.$$

According to the XOR function of the logical function circuitry 511a, 512a, the signal supplied by the respective source 502, 504 remains unchanged if the test signal T is 0 (normal mode) and it is inverted in case the test signal T is 1 (test mode). As indicated by the table above, the test mode is initiated by the destination 501 by setting A=1 and B=0 and the normal mode is initiated by the destination 501 by setting A=0 and B=1.

Advantageously, a stuck-at-fault of the test signals A and/or B becomes apparent:

If the signal A is stuck at 0, the test mode cannot be entered, which becomes apparent at the destination 501 by applying the inverse function I_FUNC on the received signals X and Y for an initiated (but due to the fault of the signal A not translated into T=1) test mode.

If the signal A is stuck at 1, the normal mode cannot be entered, which becomes apparent at the destination 501 by applying the inverse function I_FUNC on the received signals X and Y for an initiated (but due to the fault of the signal A not translated into T=0) normal mode.

If the signal B is stuck at 0, the normal mode cannot be entered, which becomes apparent at the destination 501 by applying the inverse function I_FUNC on the received signals X and Y for an initiated (but due to the fault of the signal B not translated into T=0) normal mode.

If the signal B is stuck at 1, the test mode cannot be entered, which becomes apparent at the destination 501 by applying the inverse function I_FUNC on the received signals X and Y for an initiated (but due to the fault of the signal B not translated into T=1) test mode.

As indicated above, the inverse function I_FUNC applied at the destination is also the XOR function: If the test mode is triggered, the signals X, Y are XOR-ed with 1 (i.e., the signals X, Y are inverted in case the test mode is set to 1). Otherwise (i.e., in the normal mode), the inverse function I_FUNC does not change the signals X, Y.

Figure 6:
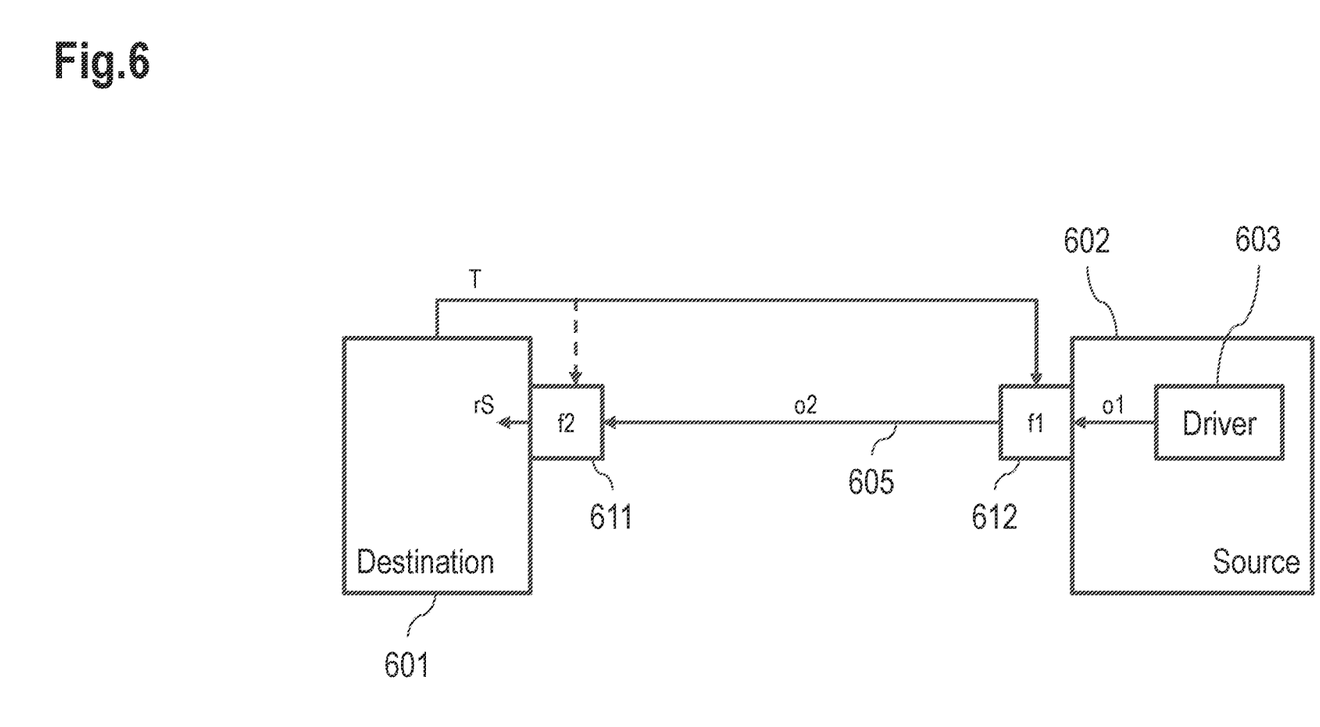
FIG. 6 shows a schematic block diagram illustrating an exemplary single source that communicates with a destination via a line.

FIG. 6 shows a block diagram illustrating an exemplary embodiment provided by the approach described herein. Here, only a single source 602 is shown that communicates with a destination 601 via a line 605. The line 605 may be realized as a physical or logical connection.

The approach, however, can be applied accordingly for several sources that communicate with the destination 601.

The source 602 comprises a driver 603 and a logical function circuitry 612 is provided as an interface to the line 605. On the opposite side of the line 605, a logical function circuitry 611 is provided as an interface to the destination 601.

A test signal T is supplied by the destination 601 to the logical function circuitry 612. Also, the test signal T is made available to the logical function circuitry 611 (indicated by the dashed line). The test signal T can be conveyed to the source via a dedicated or a shared medium. In some embodiments, a bus message may be used to convey the test signal T.

In the example shown in FIG. 6, the driver 603 provides a first output o1 to the logical function circuitry 611, which determines a second output o2 based on a function f1 based on the test signal T as follows:

$$o2=f1(T,o1).$$

The second output o2 is then conveyed across the line 605 to the logical function circuitry 612 at the receiver, which determines a received signal rS based on a second function f2 as follows:

$$rS=f2(T,o2).$$

The second function f2 may be inverse to the first function f1. If the XOR function is used, this XOR function can be used as function f1 and as function f2.

The test can be conducted for two subsequent time intervals with different test signals T (T=0 and T=1). Toggling the test signal T should also invert the second output signal o2 during the second time interval. If the second output signal o2 is not inverted during the second time interval, this can be detected at the destination and hints towards a stuck-at-fault.

As an option, time delays introduced by signal runtimes may be considered to determine a suitable time for sampling the signals.

It is another option that the test signal T comprises several signals and that an additional logic circuitry is provided at the source in order to derive a test signal based on these several signals. Reference is made to FIG. 5 above.

In one or more examples, the functions described herein may be implemented at least partially in hardware, such as specific hardware components or a processor. More generally, the techniques may be implemented in hardware, processors, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium, i.e., a computer-readable transmission medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a single hardware unit or provided by a collection of interoperative hardware units, including one or more processors as described above, in conjunction with suitable software and/or firmware.

EXAMPLES

The present disclosure provides methods and systems for efficiently determining errors along connections between at least one source and a destination.

The examples suggested herein may in particular be based on at least one of the following embodiments. Combinations of the following features may be utilized to reach a desired result. The features of the method could be combined with any feature(s) of the device, apparatus or system or vice versa.

In some examples, a method is provided for testing of at least one source by a destination, the method comprising: supplying, from the destination, a test signal towards the at least one source; determining, at the at least one source, a second output signal based on a first output signal and the test signal via a first function; conveying the second output signal to the destination; determining, at the destination, a received signal based on the second output signal received from the at least one source and based on the test signal via a second function; and determining whether an error occurred based on the received signal.

Such testing of the source may in particular be directed to a connection between the source and the destination. In this context, the source may appear to be defective if an error occurs due to the connection towards the destination.

It may be advantageous if the first function is implemented at the signal source boundary towards the line to the destination. There, the first output signal is converted into the second output signal utilizing the first function (and the test signal).

One embodiment presented in particular allows detecting any stuck-at-fault of the signal that is conveyed across a connection (line) from the at least one source to the destination.

This approach increases the reliability of safety important applications, in particular with regard to alarm notification that are conveyed from the at least one source towards the destination.

Hence, the first function f1 can be summarized as a function of the test signal and the first output signal as follows:

$$o2=f1(T,o1),$$

wherein f1 is the first function, T is the test signal, o1 is the first output signal and o2 is the second output signal.

The operation based on the second function f2 may be summarized as $$rS=f2(T,o2),$$

wherein f2 is the second function and rS is the received signal that can be used for further processing. If the function f1 is inverse to the function f2 the signal rS can be used for further processing.

If the test signal is toggled, i.e., changed from 0 to 1 or vice versa, two subsequent test periods reveal a stuck-atfault, because the signal rS as well as the signal o2 should be inverted for two subsequent test periods with different test values T.

According to an example, the method further comprises: determining whether an error occurred based on the received signal and based on a preceding received signal for a different value of the test signal.

According to an example, the method further comprises: supplying, from the destination, different test signals towards the at least one source, wherein the different test signals toggle a test mode on and off; determining, at the at least one source, for each different test signal a third output signal based on the first output signal and the different test signal via the first function; conveying the third output signal determined from each different test signal to the destination; determining, at the destination, second received signals for each different test signal based on the third output signal; and determining that an error occurred when the second received signals for the different test signals fulfill a predetermined condition and determining that no error occurred otherwise.

According to an example, the predetermined condition is an inversion of the second received signals or a non-inversion of the second received signals.

According to an example, the first function is an inverse function of the second function.

According to an example, the first function is an XOR-function and the second function is an XOR-function.

According to an example, the test signal is a binary signal.

According to an example, the test signal comprises at least two binary signals.

According to an example, the method further comprises: determining whether an error occurred based on the received signal by applying a time delay filter that takes into account time delays for the test signal and the second output signal to arrive at the at least one source and at the destination, respectively.

According to an example, the time delay filter is provided at the destination.

According to an example, a test period is determined such that a test mode is activated or deactivated for a duration long enough that the test signal and the second output signal reach the at least one source and the destination, respectively.

According to an example, the destination is a microcontroller, a safety management unit, or an electronic control unit.

According to an example, the at least one source is or comprises at least one of the following: a driver, a sensor, an alarm device, and/or an integrated circuit function.

In further examples, a method is provided for testing of at least one source by a destination, the method comprising: supplying, from the destination, a test signal towards the at least one source, wherein the test signal comprises at least two binary signals; determining, at the at least one source, a combined test signal based on the at least two binary signals by a logical circuit; determining, at the at least one source, a second output signal based on a first output signal and the combined test signal via a first function; conveying the second output signal to the destination; determining, at the destination, a received signal based on the second output signal received from the at least one source and based on the test signal via a second function; and determining whether an error occurred based on the received signal.

For example, the test signal may comprise binary signals A and B. The logical circuitry at the source determines a combined test signal as a logical function of the binary signals A and B. The combined test signal is then used by the first function to determine the second output signal. On the destination, the binary signals A and B can be used accordingly on the received signal to determine whether or not an error has occurred. This approach beneficially allows determining a stuck-at-fault of any of the binary signals A or B.

According to an example, the combined test signal is determined based on the at least two binary signals via a third function, wherein the third function is different from the first function.

According to an example, the third function comprises an AND-function and an XOR-function.

According to an example, the first function is an XOR-function and the second function is an XOR-function.

Also, a system for testing of at least one source by a destination is provided, the system configured to: supply, from the destination, a test signal towards the at least one source; determine, at the at least one source, a second output signal based on a first output signal and the test signal via a first function; convey the second output signal to the destination; determine, at the destination, a received signal based on the second output signal received from the at least one source and based on the test signal via a second function; and determine whether an error occurred based on the received signal.

According to an example, the system comprises at least one of the following: a safety related data storage, a safety related data processing, and a safety related control of data operations.

According to an example, the at least one source comprises a driver, wherein the system is configured to provide, from the driver, the first output signal.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A method for testing of at least one source circuit by a destination circuit, the method comprising:
   outputting a test signal, from the destination circuit, towards the at least one source circuit;
   determining, at the at least one source circuit, a second output signal based on a first output signal and the test signal via a first function;
   outputting the second output signal, from the at least one source circuit, to the destination circuit;
   determining, at the destination circuit, a received signal based on the second output signal received from the at least one source circuit and based on the test signal via a second function; and
   determining, at the destination circuit, whether an error occurred based on the received signal.

2. The method according to claim 1, further comprising:
　determining, at the destination circuit, whether the error occurred based on the received signal and based on a preceding received signal for a different value of the test signal.

3. The method according to claim 2, further comprising:
　supplying, from the destination circuit, different test signals towards the at least one source circuit, wherein the different test signals toggle a test mode on and off;
　determining, at the at least one source circuit, for each different test signal a third output signal based on the first output signal and the different test signal via the first function;
　conveying, from the at least one source circuit, the third output signal determined from each different test signal to the destination circuit;
　determining, at the destination circuit, second received signals for each different test signal based on the third output signal; and
　determining, at the destination circuit, that another error occurred when the second received signals for the different test signals fulfil a predetermined condition and determining that no error occurred otherwise.

4. The method according to claim 3, wherein the predetermined condition is an inversion of the second received signals or a non-inversion of the second received signals.

5. The method according to claim 1, wherein the first function is an inverse function of the second function.

6. The method according to claim 1, wherein the first function is an XOR-function and the second function is an XOR-function.

7. The method according to claim 1, wherein the test signal is a binary signal.

8. The method according to claim 1, wherein the test signal comprises at least two binary signals.

9. The method according to claim 1, the method further comprising:
　determining, at the destination circuit, whether the error occurred based on the received signal by applying a time delay filter that takes into account time delays for the test signal and the second output signal to arrive at the at least one source circuit and at the destination circuit, respectively.

10. The method according to claim 9, wherein the time delay filter is provided at the destination circuit.

11. The method according to claim 9, wherein a test period is determined such that a test mode is activated or deactivated for a duration long enough that the test signal and the second output signal reach the at least one source circuit and the destination circuit, respectively.

12. The method according to claim 1, wherein the destination circuit is a microcontroller, a safety management unit, or an electronic control unit.

13. The method according to claim 1, wherein the at least one source circuit is or comprises at least one of: a driver, a sensor, an alarm device, and/or an integrated circuit function.

14. A system for testing of at least one source circuit by a destination circuit, the system configured to:
　output a test signal, from the destination circuit, towards the at least one source circuit;
　determine, at the at least one source circuit, a second output signal based on a first output signal and the test signal via a first function;
　output the second output signal, from the at least one source circuit, towards the destination circuit;
　determine, at the destination circuit, a received signal based on the second output signal received from the at least one source circuit and based on the test signal via a second function; and
　determine, at the destination circuit, whether an error occurred based on the received signal.

15. The system according to claim 14, wherein the system comprises at least one of the following: a safety related data storage, a safety related data processing, and a safety related control of data operations.

16. The system according to claim 14, wherein the at least one source circuit comprises a driver, wherein the system is configured to provide, from the driver, the first output signal.

17. A method for testing of at least one source circuit by a destination circuit, the method comprising:
　outputting a test signal, from the destination circuit, towards the at least one source circuit, wherein the test signal comprises at least two binary signals;
　determining, at the at least one source circuit, a combined test signal based on the at least two binary signals by a logical circuit;
　determining, at the at least one source circuit, a second output signal based on a first output signal and the combined test signal via a first function;
　outputting the second output signal, from the at least one source circuit, towards the destination circuit;
　determining, at the destination circuit, a received signal based on the second output signal received from the at least one source circuit and based on the test signal via a second function; and
　determining, at the destination circuit, whether an error occurred based on the received signal.

18. The method according to claim 17, wherein the combined test signal is determined based on the at least two binary signals via a third function, wherein the third function is different from the first function.

19. The method according to claim 18, wherein the third function comprises an AND-function and an XOR-function.

20. The method according to claim 19, wherein the first function is an XOR-function and the second function is an XOR-function.

* * * * *